US009158868B2

(12) United States Patent
Jomaa et al.

(10) Patent No.: US 9,158,868 B2
(45) Date of Patent: Oct. 13, 2015

(54) VEHICLE POWERTRAIN MOUNTING SYSTEM AND METHOD OF DESIGNING SAME

(71) Applicant: GM GLOBAL TECHNOLOGY OPERATIONS LLC, Detroit, MI (US)

(72) Inventors: Sam M. Jomaa, Northville, MI (US); Daniel F. Weir, Brighton, MI (US)

(73) Assignee: GM Global Technology Operations LLC, Detroit, MI (US)

(*) Notice: Subject to any disclaimer, the term of this patent is extended or adjusted under 35 U.S.C. 154(b) by 0 days.

(21) Appl. No.: 14/097,312

(22) Filed: Dec. 5, 2013

(65) Prior Publication Data

US 2015/0053496 A1    Feb. 26, 2015

Related U.S. Application Data

(60) Provisional application No. 61/868,814, filed on Aug. 22, 2013.

(51) Int. Cl.
| | |
|---|---|
| *G06F 17/50* | (2006.01) |
| *F16F 15/00* | (2006.01) |
| *B62D 65/00* | (2006.01) |
| *B60K 5/12* | (2006.01) |

(52) U.S. Cl.
CPC .............. *G06F 17/50* (2013.01); *B60K 5/1208* (2013.01); *B60K 5/1283* (2013.01); *B62D 65/00* (2013.01); *F16F 15/00* (2013.01); *G06F 17/5095* (2013.01)

(58) Field of Classification Search
CPC ...... B60K 5/12; B60K 5/1208; B60K 5/1216; B60K 5/1275; F16F 15/00

USPC ................ 180/291, 292, 293, 299, 311, 312; 267/140.11

See application file for complete search history.

(56) References Cited

U.S. PATENT DOCUMENTS

| | | | | | |
|---|---|---|---|---|---|
| 3,825,090 | A  | * | 7/1974  | Runkle et al. ................. | 180/292 |
| 4,240,517 | A  | * | 12/1980 | Harlow et al. ................ | 180/295 |
| 4,889,207 | A  | * | 12/1989 | von Broock ................... | 180/291 |
| 6,390,223 | B1 | * | 5/2002  | Savage et al. ................. | 180/300 |
| 7,040,446 | B2 | * | 5/2006  | Anzai et al. ................... | 180/312 |
| 7,874,395 | B2 | * | 1/2011  | Taji et al. ...................... | 180/300 |
| 7,923,955 | B2 | * | 4/2011  | Shin et al. ...................... | 318/611 |
| 8,479,868 | B2 | * | 7/2013  | Wakatsuki et al. ........... | 180/299 |
| 8,651,217 | B2 | * | 2/2014  | Kim et al. ...................... | 180/292 |
| 2004/0031638 | A1 | * | 2/2004 | Kramer et al. ................ | 180/291 |
| 2007/0260377 | A1 | * | 11/2007 | Miyahara et al. .............. | 701/41 |
| 2012/0090912 | A1 | * | 4/2012 | Gannon et al. ................ | 180/312 |
| 2014/0137830 | A1 | * | 5/2014 | Satou et al. ................ | 123/192.2 |

* cited by examiner

*Primary Examiner* — John Walters
*Assistant Examiner* — Brian Swenson
(74) *Attorney, Agent, or Firm* — Quinn Law Group, PLLC

(57) ABSTRACT

A powertrain mounting system for a vehicle powertrain includes a first powertrain mount that exhibits a first gradual rate of change of static stiffness when under load. The mounting system also includes a second powertrain mount that exhibits a second gradual rate of change of static stiffness when under load. The first gradual rate of change of static stiffness is related to the second gradual rate of change of static stiffness by a static equilibrium torque balance equation of respective displacements at the first and the second powertrain mounts. The static equilibrium torque balance equation is based in part on a spatial arrangement of the first and the second powertrain mounts relative to the powertrain. A method of designing the powertrain mounting system determines the first and second gradual rates of change of static stiffness under load to achieve efficient energy management.

18 Claims, 8 Drawing Sheets

VEHICLE POWERTRAIN MOUNTING SYSTEM AND METHOD OF DESIGNING SAME

CROSS-REFERENCE TO RELATED APPLICATIONS

This application claims the benefit of U.S. Provisional Application No. 61/868,814 filed on Aug. 22, 2013, which is hereby incorporated by reference in its entirety.

TECHNICAL FIELD

The present teachings generally include a method of designing a vehicle powertrain mounting system, and a powertrain mounting system designed according to the method.

BACKGROUND

Vehicle powertrains typically include a motive source, such as an engine, and include a transmission that provides power from the motive source to the wheels. A powertrain mounting system is used to mount the powertrain to vehicle structural members, such as the engine cradle. Mounting elements can include elastic mounts, usually including a rubber portion. In some powertrain arrangements, the mounting system may include a strut that combines hydraulic damping and elastic deformation of a rubber element to react against torque loads of the powertrain.

SUMMARY

A powertrain mounting system is provided that utilizes a graduality specification for mount static stiffness under dynamic loads, and is designed according to a method using the graduality specification so that the rotational stiffness of the powertrain mounting system is balanced. Specifically, a powertrain mounting system for a vehicle powertrain includes a first powertrain mount that exhibits a first gradual rate of change of static stiffness when under load. The mounting system also includes a second powertrain mount that exhibits a second gradual rate of change of static stiffness when under load. The first gradual rate of change of static stiffness is related to the second gradual rate of change of static stiffness by a static equilibrium torque balance equation of respective torques at the first and the second powertrain mounts. The static equilibrium torque balance equation is based on a spatial arrangement of the first and the second powertrain mounts relative to the powertrain.

A method of designing the powertrain mounting system includes selecting a first gradual rate of change of static stiffness under load for the first powertrain mount. The first gradual rate of change of static stiffness of the first powertrain mount includes a first average rate of change of static stiffness in a first range of dynamic loads, and a second average rate of change of static stiffness in a second range of dynamic loads. The first average rate of change of static stiffness is less than the second average rate of change of stiffness, and the loads in the first range of dynamic loads are lower than the loads in the second range of dynamic loads. Optionally, the first gradual rate of change of static stiffness can also include a third average rate of change of static stiffness that is higher than the second average rate of change of stiffness and that occurs in a third range of dynamic loads. Loads in the third range are larger than the loads in the second range.

The method includes determining a corresponding second gradual rate of change of static stiffness under load for the second powertrain mount using the selected first gradual rate of change of static stiffness in a static equilibrium torque balance equation of respective torques at at least the first and the second powertrain mounts based on the spatial arrangement of at least the first and second powertrain mounts. Under the method, a powertrain mounting system is then provided that has the first powertrain mount with the first gradual rate of change of static stiffness, and the second powertrain mount with the corresponding second gradual rate of change of static stiffness. Because the second gradual rate of change of static stiffness of the second powertrain mount is based on the torque balance equation, the rotational stiffness of the powertrain mounting system is balanced, resulting in balanced displacements to minimize motion at the center of gravity of the powertrain.

The powertrain mounting system provided under the method manages energy of powertrain motion to reduce loads in the powertrain mounts, while limiting stiffness in the mounts for noise and vibration isolation, such as in the first range of dynamic loads. More efficient (i.e., lighter) structures of the powertrain, the powertrain mounts, and the powertrain support structure, such as the body or chassis, may thus be possible. Improved powertrain response to transient load input, such as a garage shift, and utilization of particular powertrain mount systems, such as the three-point pendular mounting system, over a greater range of dynamic loading may be possible. The components of known powertrain mounting system are designed (i.e., "tuned") with load-deflection characteristics without a graduality specification as disclosed herein, and thus cannot emphasize isolation of noise and vibration of the powertrain in some ranges, and restriction of powertrain travel in other ranges (such as during pitch or roll of the powertrain as can occur during vehicle acceleration) as can powertrain mounting systems designed according to the method disclosed herein. Mounting systems designed with the graduality specification disclosed herein will be more efficient at managing dynamic torque loads. The method is adaptable to different powertrains with different powertrain mounting systems according to the spatial arrangement of the powertrain mounts reacting powertrain torques.

The powertrain mounting system designed according to the method disclosed herein is efficient at managing kinetic energy of the powertrain due to transient oscillating torque load input (for example; garage shift, engine start-stop, tip-in/tip-out, etc.). The graduality specification of stiffness of the first and second mounts provides pseudo damping in the system due to the continuously changing powertrain natural resonant frequency, without requiring the higher component content of a hydraulic damper.

The above features and advantages and other features and advantages of the present teachings are readily apparent from the following detailed description of the best modes for carrying out the present teachings when taken in connection with the accompanying drawings.

DETAILED DESCRIPTION

Figure 1:
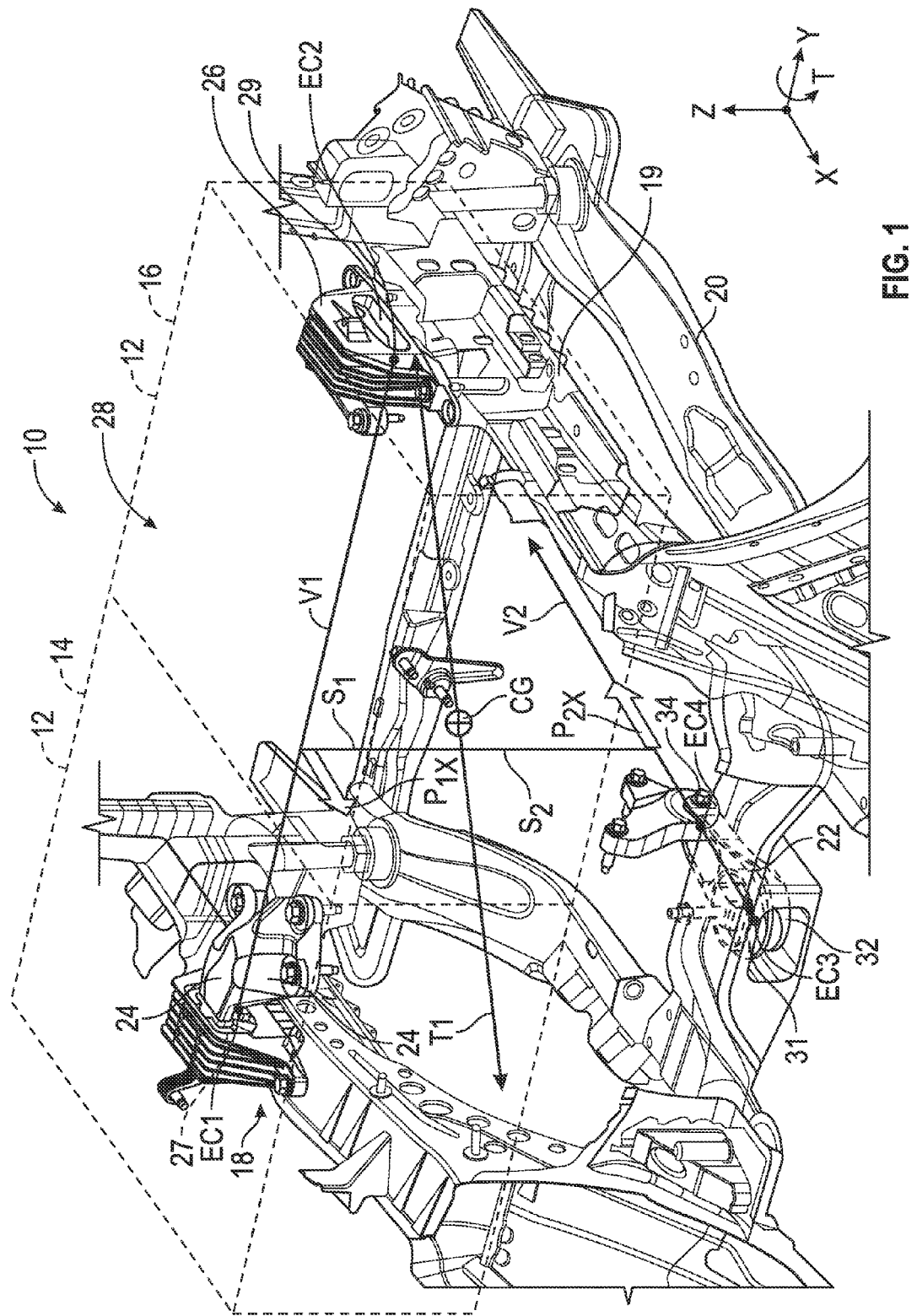
FIG. 1 is a schematic illustration in fragmentary perspective view of a portion of a first embodiment of a vehicle with a first embodiment of a powertrain (shown in phantom) having a first embodiment of a powertrain mounting system.

Referring to the drawings, wherein like reference numbers refer to like components, FIG. 1 shows a portion of a vehicle 10 that includes a powertrain 12 shown schematically in phantom. In the embodiment shown, the powertrain 12 includes an engine 14 drivingly connected to a transmission 16. In other embodiments, the powertrain may not have an engine or a transmission. For example, the powertrain may use an electric motor instead of or in addition to an engine. A powertrain mounting system 18 supports the powertrain 12 relative to load-bearing vehicle support structure, such as the vehicle body 19 and the vehicle chassis, which includes an engine cradle 20. The powertrain 12 is a transversely-oriented powertrain, and the powertrain mounting system 18 is a three-point pendular mounting system.

The powertrain mounting system 18 includes a first powertrain mount 22, also referred to herein as a rear torque strut 22. The powertrain mounting system 18 also includes a second powertrain mount 24, also referred to herein as a first side transmission mount 24 or as a left-side transmission mount 24. The powertrain mounting system 18 includes a second side engine mount 26, also referred to herein as a right-side engine mount 26. The rear torque strut 22, the left-side transmission mount 24, and the right-side engine mount 26 are arranged in a spatial arrangement 28 relative to one another and to a center of gravity CG of the powertrain 12. More specifically, the powertrain 12 has a torque roll axis T1 that goes through the center of gravity CG. A virtual line V1 runs through the elastic centers EC1 and EC2 of elastomeric portions 27, 29 of the left-side transmission mount 24 and the right-side engine mount 26. Another virtual line V2 runs through the elastic centers EC3 and EC4 of elastomeric portions of bushing 32 (shown and discussed with respect to FIG. 9), and elastomeric portion 33 of bushing 34 of the rear torque strut 22. A distance $S_1$ is from the virtual line V1 to the torque roll axis T1, and a distance $S_2$ is from the virtual line V2 to the torque roll axis T1. Both distances $S_1$ and $S_2$ are measurements taken along a vertical line (i.e., along the Z-axis) that intersects virtual lines V1, V2.

Figure 8:
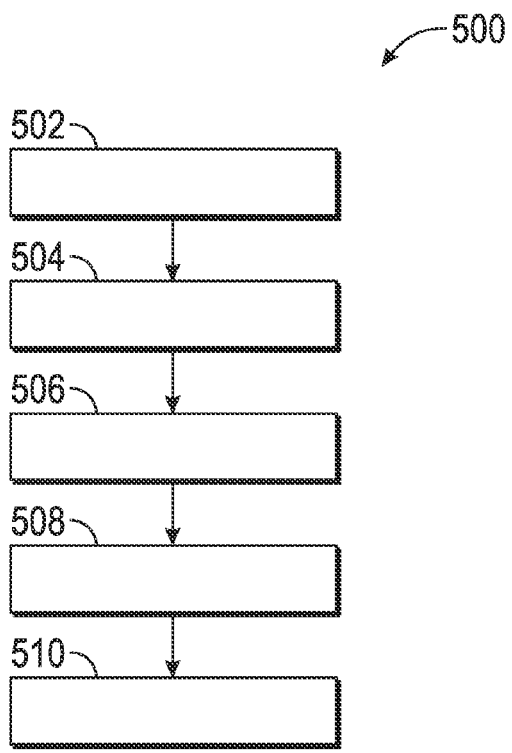
FIG. 8 is a flow diagram of a method of designing the powertrain mounting systems of FIGS. 1-7.

The powertrain mounting system 18 is designed according to a method 500 shown as a flow diagram in FIG. 8 and described in detail with respect to FIG. 8. Under the method 500, the first powertrain mount, i.e., the rear torque strut 22, is designed with a "graduality stiffness" specification. As used herein, a "graduality stiffness" specification is a gradual rate of change of static stiffness in a given direction under dynamic load. More specifically, as shown in the plot 100 of FIG. 2, the rear torque strut 22 exhibits a "gradual rate of change of static stiffness" when under load that is specified by the average rates of static stiffness 102 in Newtons per millimeter (N/mm) per Newton in different dynamic load zones, with the static load 104 measured in Newtons (N). The different load zones are associated with the dynamic load that is the result of torque of the powertrain 12 about the vehicle Y-axis. Load zones Z1 and ZA include such events as vehicle cruising; low and high acceleration maneuvers; vehicle idle on level or inclined ground; and also transient conditions of the powertrain 12, including start/stop events, key-on/key-off events, garage shifts, and tip-in or tip-out of the accelerator pedal. Load zones Z2 and ZB include such events as acceleration or deceleration over rough roads, acceleration or deceleration over slippery or gravel roads, or similar events that cause excessive oscillation of the vehicle drive axle. Load zones Z3 and ZC include such events as aggressive powertrain operation under high engine speeds and/or abrupt shifting in transmission gears.

Figure 2:
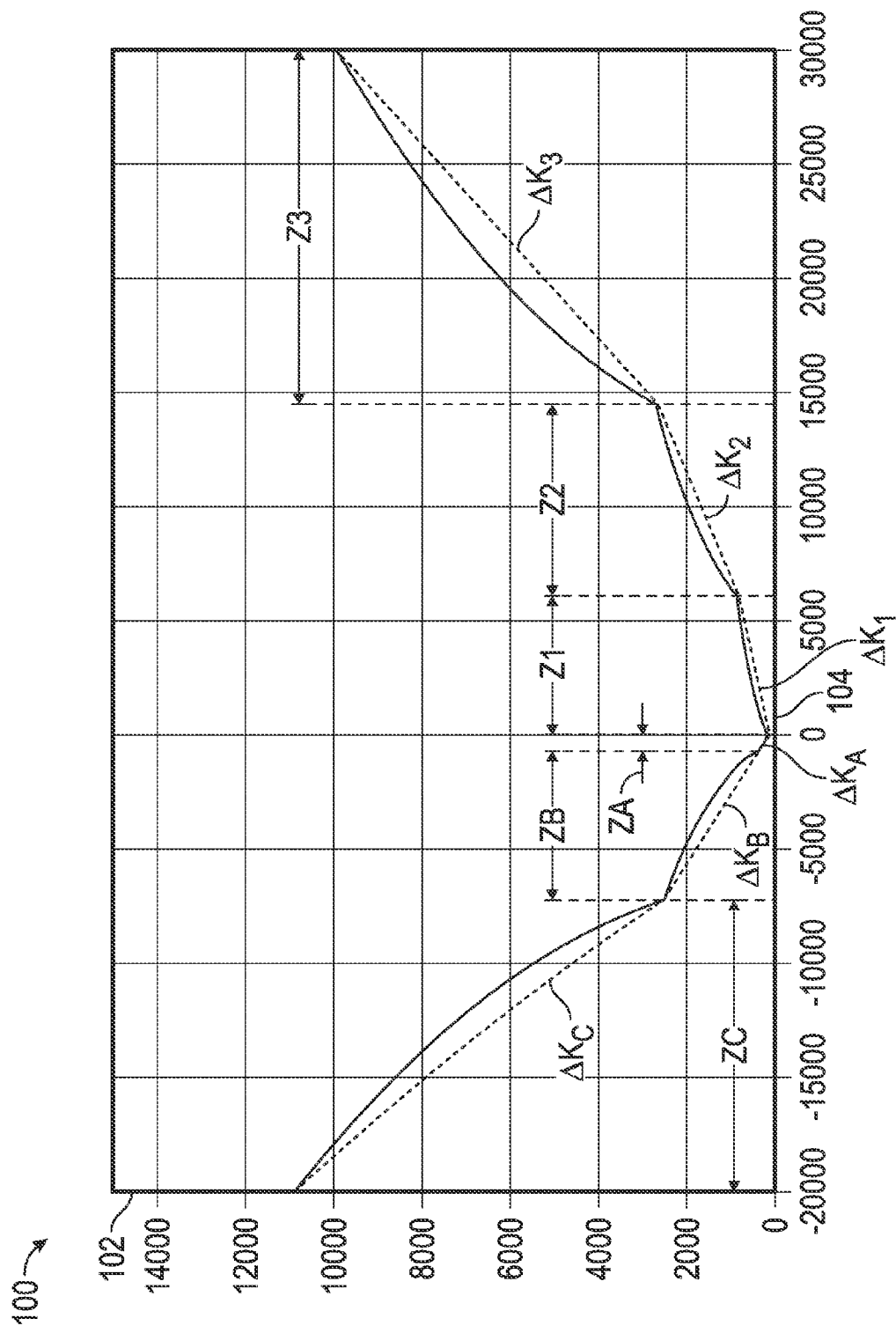
FIG. 2 is a representative plot of stiffness in Newtons per millimeter (N/mm) versus force in Newtons (N) for a first powertrain mount of the powertrain mounting system of FIG. 1.

Table I lists rates of change in static stiffness (i.e., average graduality stiffness in (N/mm)/N) of the first powertrain mount 22 corresponding with the plot 102 of FIG. 2 for the different load management zones described by the associated forces in Newtons (N) on the first powertrain mount 22. The numerical values of FIG. 2 and Table I are by way of non-limiting example only, and different suitable gradual rates of change of stiffness as well as different load zones (i.e., ranges of dynamic loads) can be selected within the scope of the present teachings, as long as the selected load management zones and gradual rates of change of stiffness fall within the predetermined limits listed in Table I. in order to ensure that the powertrain mounting system 18 provides efficient energy management. It should also be appreciated that the powertrain mounting systems described herein are by way of non-limiting example only. The graduality stiffness specification and the method of designing a powertrain mounting system disclosed herein can be readily applied to powertrain mounting systems with mounts having other spatial arrangements than those shown herein. The values shown in TABLE. 1 apply equally to all such transversely-oriented powertrain mounting systems, as well as to the transversely-oriented powertrain mounting systems that are specifically described herein (i.e., powertrain mounting systems 18, and 318). The values for longitudinally oriented powertrain mounting systems maybe selected within the scope of the present teachings, as long as the selected load management zones and gradual rates of change of stiffness fall within the predetermined limits listed in TABLE I.

TABLE I

| Load Management Zones | Force (N) | Average Graduality ((N/mm)/N) (also referred to as average rate of change of static stiffness under load) |
|---|---|---|
| ZC - Reverse Extreme Loads | <Maximum Predetermined High Cycle Load (e.g., −7000) | ≤|−0.50| [as low as possible without exceeding a predetermined total displacement in the mount] |
| ZB - Reverse Moderate Loads | Maximum Predetermined High Cycle Load (e.g., −7000) to <Maximum Pleasability Load | 0.35 [larger than ZA rate and smaller than ZC rate as needed for a smooth transition between end of ZA range and beginning of ZC range] |
| ZA - Reverse Drive Isolation Zone | Maximum Pleasability Load to 0 | −0.25 [as large as possible w/o exceeding one or more predetermined vehicle isolation requirements as determined by any other suitable method] |
| Z1 - Forward Drive Isolation Zone | 0 to Maximum Pleasability Load (e.g., 1$^{st}$ gear wide open throttle) (e.g., 7000) | 0.15 [as large as possible w/o exceeding one or more predetermined vehicle isolation requirements as determined by any other suitable method] |
| Z2 - Moderate Loads | Maximum Pleasability Load to Maximum Predetermined High Cycle Load (e.g., 14,500) | 0.25 [larger than Z1 rate and smaller than Z3 rate as needed for a smooth transition between end of Z1 range and beginning of Z3 range] |
| Z3 -Extreme Loads | >Maximum Predetermined High Cycle Load (e.g., 14,500) | ≤0.50 [as low as possible without exceeding a predetermined total displacement in the mount] |

FIG. 2 shows that the rear torque strut 22 has three different average rates of increase in static stiffness under load from positive torque resulting in loads $P_{1x}$ and $P_{2x}$ in three corresponding load zones. The loading is in the fore-aft direction (the longitudinal, X-axis of the vehicle 10) on the powertrain mounts 22, 24, 26 and is due to dynamic torque of the powertrain 12 about the vehicle Y-axis for positive torque loading of the powertrain 12, which is torque in a clockwise direction as viewed in FIG. 1 along the positive Y-axis. The powertrain mounts 24, 26 together react a first axial load $P_{1x}$ of the powertrain 12 at a distance $S_1$ from the torque roll axis T1. The rear torque strut 22 reacts a second axial load $P_{2x}$ of the powertrain 12 at a distance $S_2$ from the torque roll axis T1. The rear torque strut 22 is configured with a first average rate of change of static stiffness $\Delta K_1$ in a first range Z1 of dynamic loads from 0 to 7000 N, a second average rate of change of static stiffness $\Delta K_2$ in a second range Z2 of dynamic loads 7000 N to 14,500 N, and a third average rate of change of static stiffness $\Delta K_3$ in a third range Z3 of dynamic loads greater than 14,500 N. It is noted that the actual rates of change of static stiffness in each of the load zones Z1, Z2, Z3 are not linear, and that the average rates of change of static stiffness $\Delta K_1$, $\Delta K_2$, and $\Delta K3$ are linear averages of the rates of change in these zones.

Additionally, FIG. 2 shows that the rear torque strut 22 has three different average rates of increase in static stiffness under load from negative torque (i.e., which would result in loads $P_{1x}$ and $P_{2x}$ in the opposite direction than shown) in three corresponding load zones ZA, ZB, ZC, with the loading in the fore-aft direction (longitudinal, X-axis of the vehicle 10) on the powertrain mounts 22, 24, 26 being due to dynamic torque of the powertrain 12 about the Y-axis T1 for negative torque loading of the powertrain 12, which is torque in a counterclockwise direction as viewed in FIG. 1 along the positive Y-axis. The rear torque strut 22 is configured with a first average rate of change of static stiffness $\Delta K_A$ in a first range ZA of dynamic loads from 0 to −600 N, a second average rate of change of static stiffness $\Delta K_B$ in a second range ZB of dynamic loads<−600 N to −7000 N, with an absolute value greater than the loads in the first range of dynamic loads, and a third average rate of change of static stiffness $\Delta K_C$ in a third range ZC of dynamic loads greater than −7000 N, and with an absolute value greater than the second range of dynamic loads. The actual rates of change of static stiffness in each of the load zones ZA, ZB, ZC are not linear, and the average rates of change of static stiffness $\Delta K_A$, $\Delta K_B$, and $\Delta K_C$ are linear averages of the rates of change in these zones.

As indicated in FIG. 2, the average rate of change of static stiffness under dynamic load increases as the absolute value of the dynamic load increases, as the first average rate of change of static stiffness $\Delta K_1$ is less than the second average rate of change of static stiffness $\Delta K_2$, which is less than the third average rate of change of static stiffness $\Delta K_3$. Additionally, the absolute value of the first average rate of change of static stiffness $\Delta K_A$ for torque in the counterclockwise direction is less than the absolute value of the second average rate of change of static stiffness $\Delta K_B$, which is less than the absolute value of the third average rate of change of static stiffness $\Delta K_C$. The first range Z1 of dynamic loads is referred to as a "pleasability loads zone" because the stiffness 102 and the first average rate of change of static stiffness $\Delta K_1$ is specifically selected to be relatively low for optimal passenger comfort under relatively low dynamic loads. The pleasability zone can also include the first range ZA for dynamic loads due to torque in the opposite direction. The second range Z2 of dynamic loads includes moderate loads that are relatively frequently experienced. The third range Z3 of dynamic loads includes even relatively extreme loads. Additionally, the ranges ZB and ZC of dynamic loads are considered load management zones, with relatively higher but limited average rates of change of static stiffness. The stiffness 102 and the second average rate of change of static stiffness $\Delta K_2$ of the rear torque strut 22 in the second load zone Z2, as well as the stiffness 102 and the third average rate of change of static stiffness $\Delta K_3$ of the rear torque strut 22 in the third load zone Z3 are gradually higher than the first average rate of change of stiffness $\Delta K_1$ in the pleasability load zone, however, to enable the powertrain mounting system 18 to manage the motion energy of the powertrain 12 and therefore reducing the loading on the powertrain mounts 22, 24, 26 while limiting the total displacement in the mount.

Figure 9:
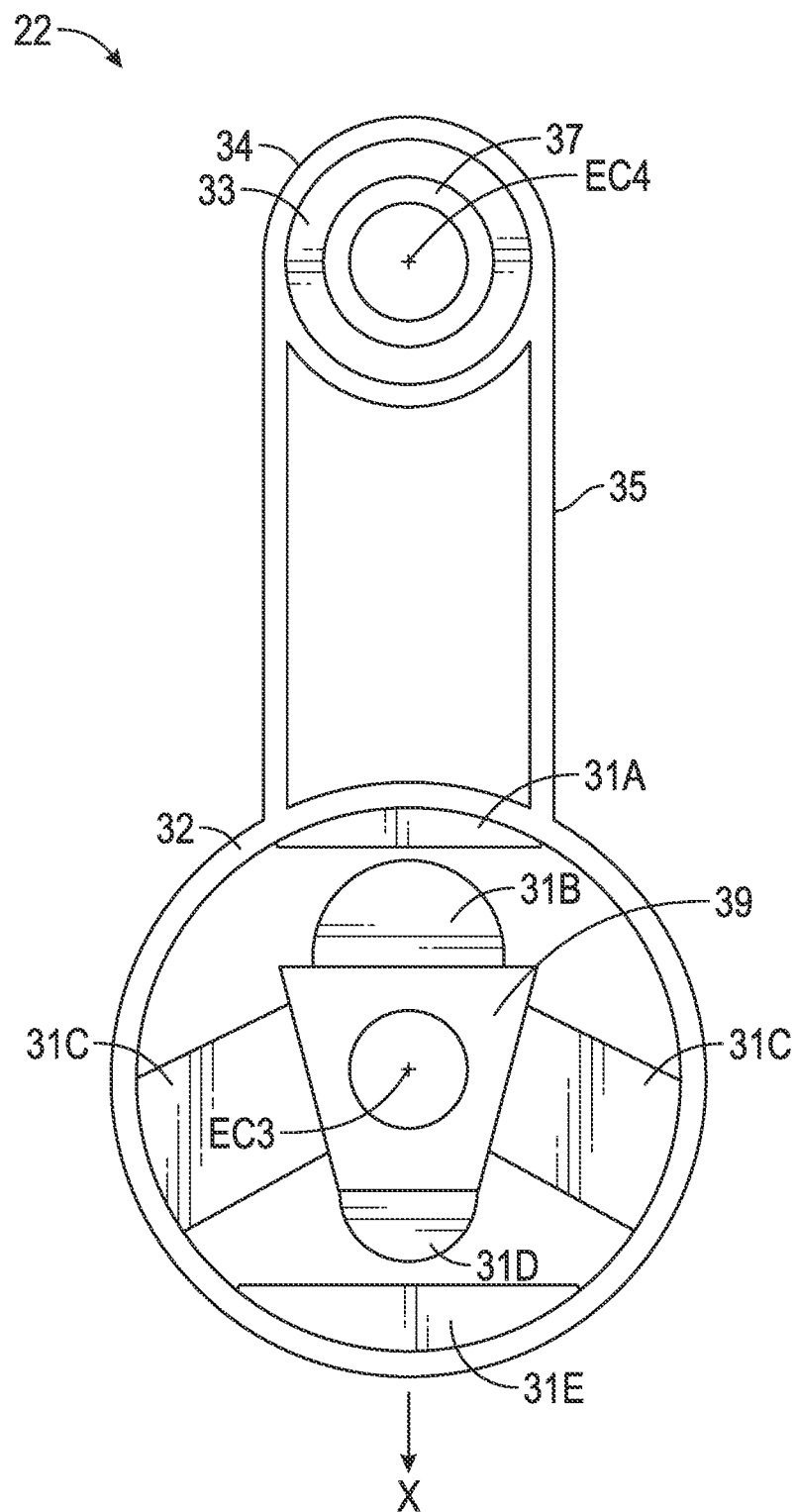
FIG. 9 is a schematic illustration in plan view of the first powertrain mount of the powertrain mounting system of FIG. 1.

The rear torque strut 22 could be designed to provide the gradual rates of change of static stiffness in many different ways, such as by providing the shape, arrangement, size, and material properties of a main spring element 31C and of bumper elastomer elements 31A, 31B, 31D, and 31E of the torque strut 22 shown in FIG. 9. The elastomeric portion 33 of bushing 34 is mounted to and extends between the mount structure 35 and a metal insert 37. The elastomeric bumper elements 31A and 31E are mounted to the mount structure 35 and face respective elastomeric bumper elements 31B, 31D mounted to a metal insert 39. The main spring elastomeric element 31C is mounted to and extends between the metal insert 39 and the mount structure 35. This arrangement of torque strut 22 is by way of example only, and other arrangements are possible where bushings 34 and 32 are variably attached to powertrain and chassis structures.

Referring now to FIG. 8, under the method 500, in step 502, a powertrain mount system is selected, including a number and spatial arrangement of the mounts relative to the powertrain. Next, a graduality specification of a first of the powertrain mounts is selected in step 504. In other words, in step 504, a first gradual rate of change of static stiffness under dynamic load is selected for the first of the powertrain mounts. Which one of the powertrain mounts serves as the first powertrain mount having the selected first gradual rate of change of static stiffness depends on the powertrain mount system selected in step 502. For example, in the pendular mount system 18 of FIG. 1, the rear torque strut 22 is the first powertrain mount, and the first gradual rate of change of static stiffness is the gradual average rates of change of static stiffness $\Delta K_1$, $\Delta K_2$, and $\Delta K_3$. The first gradual rates of change of static stiffness also include the gradual average rates of change of static stiffness $\Delta K_A$, $\Delta K_B$, and $\Delta K_C$.

The method 500 then includes step 506, determining a corresponding gradual rate of change of static stiffness under dynamic load for at least a second powertrain mount of the powertrain system. Which powertrain mount is considered the second powertrain mount depends upon the powertrain mount system selected in step 502. For example, if a pendular powertrain mount system 18 is selected, the second powertrain mount will be either one of the left-side transmission mount 24 or the right-side engine mount 26. For purposes of discussion, the left-side transmission mount 24 of FIG. 1 will be considered the second powertrain mount for the pendular powertrain mount system 18. As discussed herein, the combined X-stiffness of the left-side transmission mount 24 and of the right-side engine mount 26 balance the X-stiffness of the rear torque strut 22.

Figure 3:
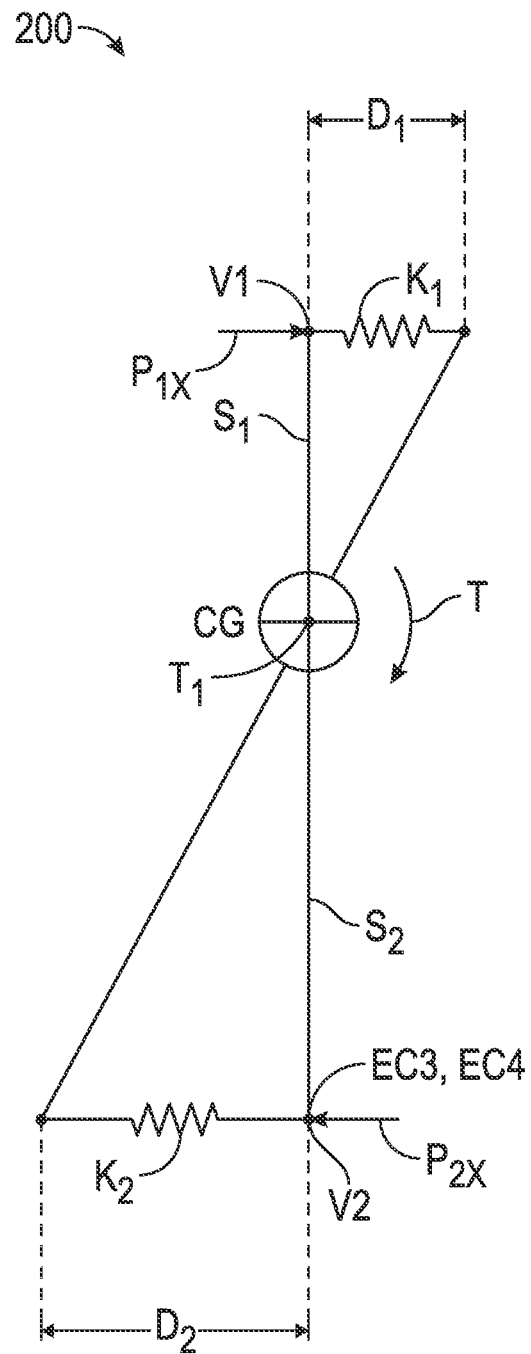
FIG. 3 is a schematic torque balance diagram of the powertrain mounting system of FIG. 1.

In step 506, the second gradual rate of change of the combined static stiffness under load of the left-side transmission mount 24 and right-side engine mount 26 is determined using the selected first gradual rate of change of static stiffness in a static equilibrium torque balance equation of respective torques at at least the first and the second powertrain mounts 22, 24 based on the spatial arrangement of at least the first and second powertrain mounts 22, 24 relative to the powertrain 12. Individual static stiffnesses of the left-side transmission mount 24 and right-side engine mount 26 can be determined from the combined static stiffness of the left-side transmission mount 24 and right-side engine mount 26. FIG. 3 shows the ideal state in which the powertrain center of gravity CG lies in the vertical plane of virtual line V2. FIG. 3 shows a diagram 200 of the force $P_{1x}$ that is reacted by the combined load bearing mounts (i.e., the left-side transmission mount 24 and the right-side engine mount 26 together) at a distance $S_1$ of the virtual line V1 from the torque roll axis T1 as described above and of the force $P_2x$ that is reacted by the torque strut 22 at the distance $S_2$ of the virtual line V2 from the torque roll axis T1 as described above. The torque T in a clockwise direction along the Y-axis causes the force $P_{1x}$ and force $P_{2x}$ which are in constant static equilibrium, and therefore $P_{1x}$ equals $P_{2x}$ in magnitude. In the present teachings, the combined stiffness $K_1$ is made proportional to the torque strut axial stiffness $K_2$ by a constant factor $(S_2/S_1)$. Therefore, the following relationship of the axial static stiffness $K_1$, $K_2$ results:

$$K_1 = K_2(S_2/S_1);$$

wherein $K_1$ is the combined load-bearing mounts 24, 26 axial static stiffness in the x-direction at a distance $S_1$ for a given powertrain 12, and $K_2$ is the rear torque strut 22 axial static stiffness in the x-direction at the distance $S_2$ for the same given powertrain 12.

As shown in FIG. 3, displacement D1 corresponding to force $P_1x$ is equal to $P_1x/K_1$ (i.e., $D1 = P_1x/K_1$) and displacement D2 corresponding to force $P_2x$ is equal to $P_2x/K_2$ ($D2 = P_2x/K_2$). This results in $D1 = D2(S1/S2)$. In other words, the motion of the powertrain 12 under torque T is such that the center of rotation is always at or close to the center of gravity CG of the powertrain 12. The avoidance of translation at the center of gravity CG of the powertrain 12 directly results in reduction of dynamic force at the mounts 22, 24, 26 in the fore/aft direction.

The representation of the three-dimensional spatial arrangement of the powertrain mounting system 18 in FIG. 1, and diagram 200 of the torque balance equation in FIG. 3 are simplifications of the physics of the powertrain mount system 18. A more specific torque balance equation, including a dynamic force equilibrium, and/or other simplifications can instead be used to determine $S_1$, $S_2$, and the corresponding relationship between the static stiffnesses $K_1$, $K_2$. For example, in FIG. 1, the center of gravity CG falls along the torque roll axis T1, but is offset from the X-Z plane through the rear toque strut 22 (i.e., the plane including the virtual line V2 and extending vertically). For simplification, the torque roll axis T1 can instead be treated as a horizontal line in the Y-direction through the center of gravity CG, and the distances $S_1$, $S_2$ can be calculated perpendicular to V1 and V2 and through such a substitute horizontal line. The two-dimensional torque balance diagram 200 of FIG. 3 utilizes this simplification of treating the torque roll axis T1 as a horizontal line through the center of gravity CG. The offset of the center of gravity CG from the X-Z plane through the virtual line V1 is relatively small, so any error in the distances $S_1$ and $S_2$ and associated calculated stiffnesses $K_1$, $K_2$ resulting from this simplification will be relatively small and can, in any event, be corrected by system simulation and on-vehicle measurements. Another simplifying assumption made in the torque balance diagram 200 of FIG. 3 is that the stiffness $K_2$ of the rear torque strut 22 is along the X-axis of the vehicle 10. The stiffness $K_2$ can instead be along an axis of the rear torque strut 22 which has at least a component in the X-direction but may not be completely horizontal.

The stiffness $K_2$ of the rear torque strut 22 in the above formula, also indicated as stiffness 102 (shown in FIG. 2), will vary according to the load 104 and according to the first gradual rate of change of static stiffness under load of the rear torque strut 22 (i.e., the rear torque strut 22 has the first graduality specification). Once the first gradual rate of change of static stiffness under load of the rear torque strut 22 is selected in step 504, a corresponding combined static stiffness $K_1$ of the load bearing mounts (left-side transmission mount 24 and the right-side engine mount 26), is known from the static equilibrium diagram 200 of FIG. 3. The corresponding static stiffness of the left-side transmission mount 24 is then known according to a selected relationship of the left-side transmission mount 24 and the right-side engine mount 26. For example, if the left-side transmission mount 24 and the right-side engine mount 26 are to each react the torque load T equally, then each can be designed to have one half of the combined static stiffness $K_1$ (i.e., $K_1/2$) that results from the torque balance equation above. A second gradual rate of change of static stiffness under load for the left-side transmission mount 24 over the same load zones of FIG. 2 would then necessarily be related to the average rates of change of static stiffness $\Delta K_1$, $\Delta K_2$, and $\Delta K_3$ according to the scale of $K_1/2$ for each stiffness value 102 shown in FIG. 2.

Once the first gradual rate of change of static stiffness under load for the first powertrain mount (e.g., rear torque strut 22) is selected in step 504, and the corresponding second gradual rate of change of static stiffness under dynamic load for the second powertrain mount (e.g., left-side transmission mount 24) is determined in step 506, the powertrain mounting system 18 having the rear torque strut 22 that exhibits the first gradual rate of change of static stiffness under load, and having the left-side transmission mount 24 that exhibits the second corresponding gradual rate of change of static stiffness under dynamic load can be provided in step 508 with the torque strut 22, the left-side transmission mount 24, and the right-side engine mount 26 having the selected spatial arrangement described with respect to FIGS. 1 and 3. The powertrain mounting system 18 can be installed on the vehicle 10 in step 510 according to the spatial arrangement described with respect to FIGS. 1 and 3. It should be appreciated that stiffness of the powertrain mounts 22, 24, 26 in other directions, such as along a Y-axis (transverse in the vehicle 10), or a Z-axis (up-and-down relative to the fore-aft X-axis) need not be gradual under the method 500, and can be determined according to any suitable method.

Figure 4:
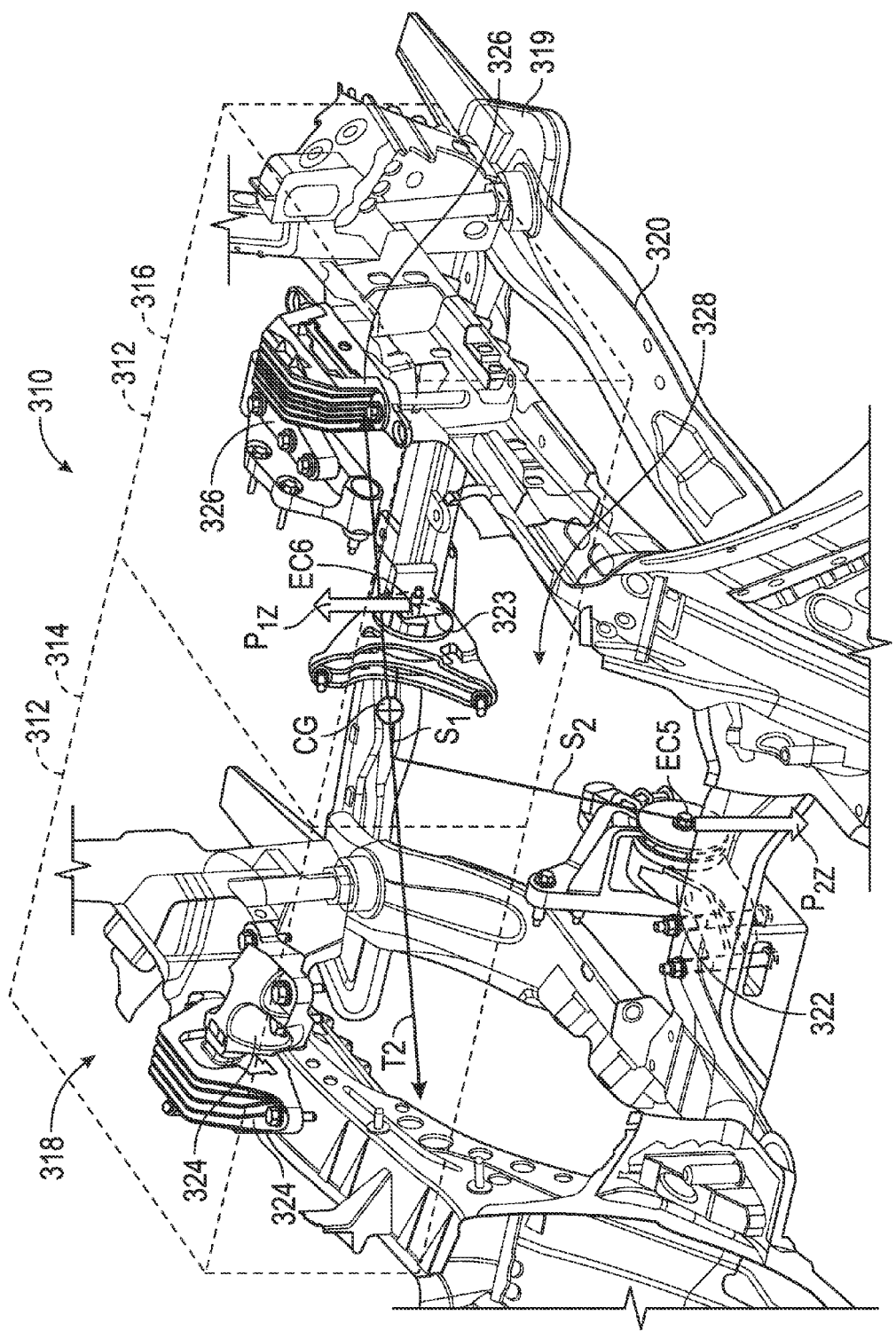
FIG. 4 is a schematic illustration in fragmentary perspective view of a portion of a second embodiment of a vehicle with a second embodiment of a powertrain (shown in phantom) having a second embodiment of a powertrain mounting system.

FIG. 4 shows a vehicle 310 with a powertrain 312. In the embodiment shown, the powertrain 312 has an engine 314 and a transmission 316 (shown only schematically in phantom) mounted by a powertrain mounting system 318 to load-bearing vehicle support structure, such as the vehicle body 319 and to the vehicle chassis, which includes an engine cradle 320. In other embodiments, the powertrain may not have an engine or a transmission. For example, the powertrain may use an electric motor instead of or in addition to an engine. The powertrain mounting system 318 includes a rear torque-reacting mount 322, a front torque-reacting mount 323, a left-side transmission mount 324, and a right-side engine mount 326. The powertrain 312 is a transversely-oriented powertrain, and the powertrain mounts 322, 323, 324, 326 are arranged in a spatial arrangement 328 that is considered a neutral-torque axis, four-point powertrain mounting system 318.

The powertrain mounting system 318 can be designed according to the method 500 of FIG. 8. For example, in step 502, the neutral-torque axis, four-point powertrain mounting system 318 is selected. In step 504, the rear torque mount 322 is selected as the first powertrain mount that has a graduality stiffness specification in the Z-direction with a first gradual rate of change of static stiffness under dynamic load. The ranges of dynamic loads selected could be the same as or different than the load zones Z1, Z2, Z3, and ZA, ZB, ZC of FIG. 2 and Table I. The average rates of change of axial static stiffness of the rear torque mount 322 could be the same as is shown in FIG. 2, or different numerical values could be selected as long as the average rate of change of static stiffness of the rear torque mount 322 increases as the absolute value of the magnitude of the ranges of loads in the load zones increases and the predetermined limitations of Table I. are met.

Figure 5:
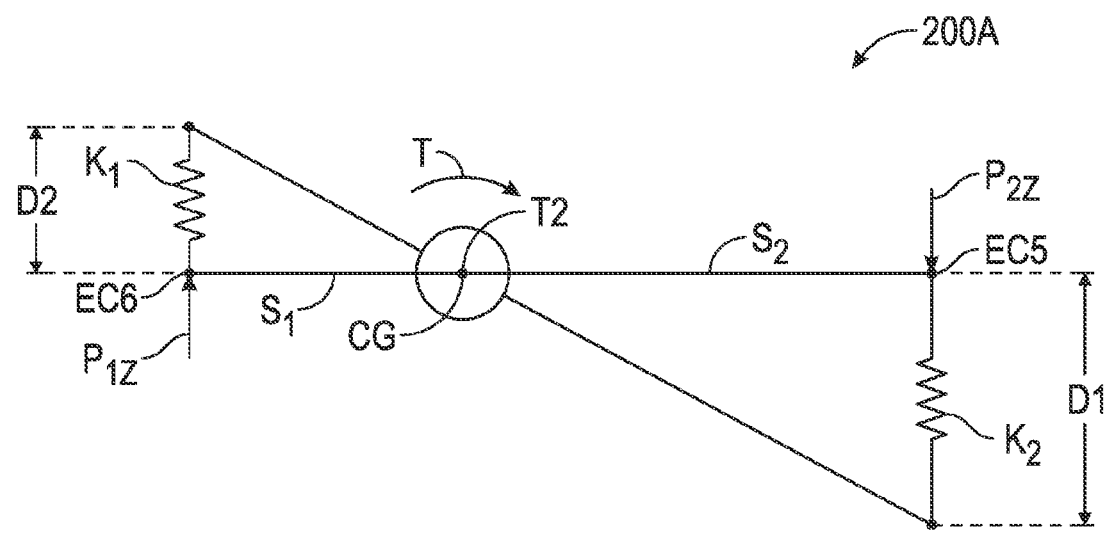
FIG. 5 is a schematic torque balance diagram of the powertrain mounting system of FIG. 4.

FIG. 5 shows a torque balance diagram 200A that is a simplification of the axial load $P_{2Z}$ in the positive Z-direction on the rear torque-reacting mount 322 and the axial load $P_{1Z}$ in the negative Z-direction on the front torque-reacting mount 323 under dynamic loads from drive axle torque of the powertrain 312 in a clockwise direction about the Y-axis of the vehicle 310. Referring to FIG. 4, $S_1$ is the distance between the elastic center EC6 of the front torque-reacting mount 323 and the torque roll axis T2 in a vertical plane extending through the elastic centers EC5, EC6 of the rear torque-reacting mount 322 and the front torque-reacting mount 323, respectively. $S_2$ is the distance between the elastic center EC5 of the rear torque-reacting mount 322 and the torque roll axis T2 in the same vertical plane that extends through the elastic centers EC5, EC6. The diagram 200A of FIG. 5 represents this arrangement. Alternatively, the distances $S_1$ and $S_2$ can be measured in a plane through the elastic centers EC5, EC6 of the front and rear torque-reacting mounts 323, 322, respectively, but perpendicular to the torque roll axis T2 rather than in a vertical plane.

As described with respect to FIGS. 1 and 2, the center of gravity CG of the powertrain mounting system 318 in FIG. 4 may actually be displaced from the vertical plane. For simplification, the torque roll axis T2 can instead be treated as a horizontal line in the Y-direction through the center of gravity CG. The two-dimensional torque balance diagram 200A of FIG. 5 utilizes this simplification of treating the torque roll axis T2 as a horizontal line through the center of gravity CG. The offset of the center of gravity CG from the vertical plane through the elastic centers EC5, EC6 is relatively small, so any error in the distance $S_1$ and $S_2$ and associated calculated stiffnesses $K_1$, $K_2$ resulting from this simplification will be relatively small and can, in any event, be corrected by system simulation and on-vehicle measurements. Another simplifying assumption made in the torque balance diagram 200A of FIG. 5 is that the stiffnesses $K_1$ and $K_2$ are in the direction of the vehicle Z-axis. The stiffnesses $K_1$, $K_2$ may instead be considered along the local Z-axis of each respective mount 323, 322, which is commonly called "focus angle" and is not perfectly aligned with vehicle Z-axis. Again, any error associated with this simplification can be corrected by system simulation and on-vehicle measurements.

In step 506, the second gradual rate of change of static stiffness $K_1$ under dynamic load of the front torque-reacting mount 323 can then be calculated using the simplified torque balance equation from the torque balance diagram of FIG. 5. Specifically, $$K_1=K_2(S_2/S_1);$$

wherein $K_1$ is the static stiffness in the Z-direction of the front torque-reacting mount 323 at a distance $S_1$ for a given dynamic load of the powertrain 312, and $K_2$ is the static stiffness in the Z-direction of the rear torque-reacting mount 322 at a distance $S_2$ for the same dynamic load of the powertrain 312. As shown in FIG. 5, displacement D1 corresponding to force $P_{1z}$ is equal to $P_{1z}/K_1$ (i.e., $D1=P_{1z}/K_1$) and displacement D2 corresponding to force $P_{2z}$ is equal to $P_{2z}/K_2$ (i.e., $D2=P_{2z}/K_2$). This results in $D1=D2(S1/S2)$; in other words, the motion of the powertrain 312 under torque T is such that the center of rotation is always at or close to the CG of the powertrain 312. The avoidance of translation at the center of gravity CG of the powertrain 312 directly results in reduction of dynamic force at the mounts 322, 323, 324, and 326 in the vertical direction.

In step 508, the powertrain mounting system 318 is provided and, in step 510, installed on the vehicle 310. The stiffness of the mounts 322 and 323 in directions other than the Z-direction, and the stiffness of the mounts 324, 326 can be determined by any suitable method.

Figure 6:
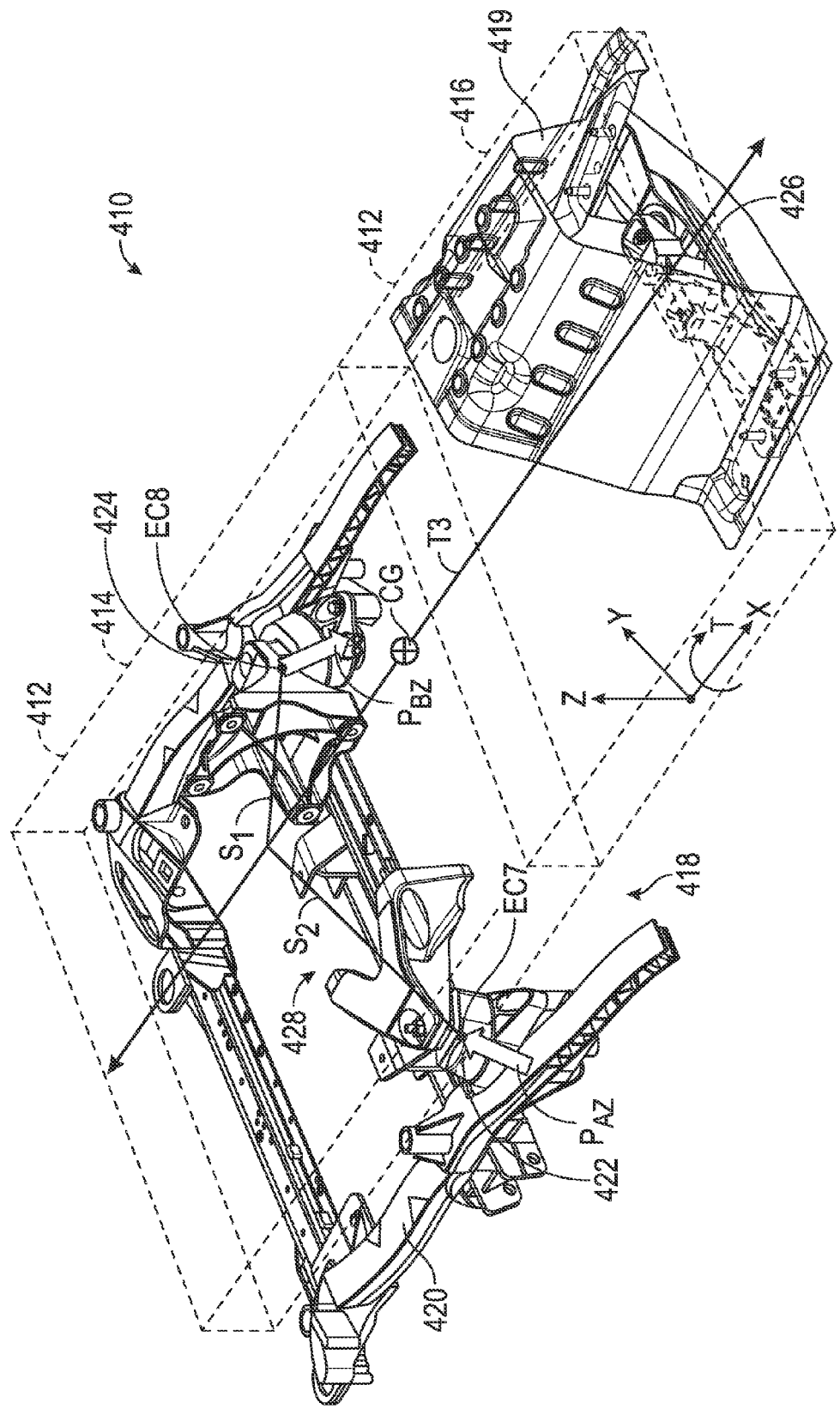
FIG. 6 is a schematic illustration in fragmentary perspective view of a portion of a third embodiment of a vehicle with a third embodiment of a powertrain (shown in phantom) having a third embodiment of a powertrain mounting system.

FIG. 6 shows a vehicle 410 with a powertrain 412. In the embodiment shown, the powertrain 412 has an engine 414 and a transmission 416 (shown schematically in phantom) mounted by a powertrain mounting system 418 to load-bearing vehicle support structure, such as the vehicle body 419 and/or the vehicle chassis 420. The engine 414 is shown mounted to the vehicle chassis 420, which includes an engine cradle. The transmission 416 is shown mounted to the body 419. In other embodiments, the powertrain may not have an engine or may not have a transmission. For example, the powertrain may use an electric motor instead of or in addition to an engine. The powertrain mounting system 418 includes a plurality of powertrain mounts such as a first-side (e.g., left-side) engine mount 422, a second-side (e.g. right-side) engine mount 424, and a rear transmission mount 426. The left-side engine mount 422 and the right-side engine mount 424 are supported by the chassis 420. In a car application, the rear transmission mount 426 would be supported by the body 419, as shown. In a truck application, the rear transmission mount 426 would be supported by the frame structure of the chassis 420. The powertrain 412 is a longitudinally-oriented powertrain, and the powertrain mounts 422, 424, 426 are arranged in a spatial arrangement 428 that is considered a longitudinal powertrain mounting system 418.

The powertrain mounting system 418 can be designed according to the method 500 of FIG. 8. For example, in step 502, the longitudinally oriented powertrain mounting system 418 is selected. In step 504, the left-side engine mount 422 can be selected as the first powertrain mount that has a graduality stiffness specification in the Z-direction with a first gradual rate of change of static stiffness under dynamic load. The ranges of dynamic loads selected could be the same or different than the load zones Z1, Z2, Z3, and ZA, ZB, ZC of FIG. 2 and Table I. The average rates of change of axial static stiffness of the left-side engine mount 422 could be the same as is shown in FIG. 2, or different numerical values could be selected as long as the average rate of change of axial static stiffness of the left-side engine mount 422 increases as the absolute value of the magnitude of the ranges of loads in the load zones increases and the predetermined limitations of Table I. are met. Alternatively, the right-side engine mount 424 could instead be selected as the first powertrain mount with a first graduality stiffness specification.

Figure 7:
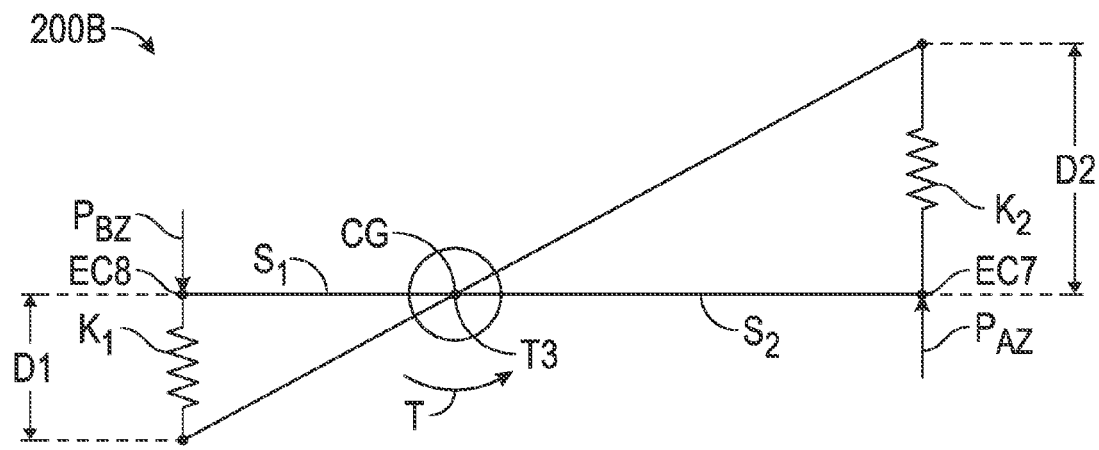
FIG. 7 schematic torque balance diagram of the powertrain mounting system of FIG. 6.

FIG. 7 shows a torque balance diagram 200B that is a simplification of the force $P_{AZ}$ in the Z-direction on the left-side engine mount 422 and the force $P_{BZ}$ in the Z-direction on the right-side engine mount 424 under dynamic loads from drive axle torque of the powertrain 412 in a counter-clockwise direction about the X-axis of the vehicle 410. Referring to FIG. 6, $S_1$ is the distance between the elastic center EC8 of the right-side engine mount 424 and the torque roll axis T3 in a vertical plane extending through through the elastic centers EC7, EC8 of the left-side and right-side engine mounts 422, 424, respectively. $S_2$ is the distance between the elastic center EC7 of the left-side engine mount 422 and the torque roll axis T3 in the same vertical plane that extends through the elastic centers EC7, EC8. The diagram 200B of FIG. 7 represents this arrangement. Alternatively, the distances $S_1$ and $S_2$ can be measured in a plane through the elastic centers EC7, EC8 of the left-side and right-side engine mounts 422, 424, respectively, but perpendicular to the torque roll axis T3 rather than a vertical plane.

As described with respect to FIGS. 1 and 2, the torque roll axis T3 is treated as a horizontal line in the X-direction through the center of gravity CG. The two-dimensional torque balance diagram 200B of FIG. 7 utilizes this simplification of treating the torque roll axis T3 as a horizontal line through the center of gravity CG. The offset of the torque roll axis T3 from a horizontal line is relatively small, so any error in the distance $S_1$ and $S_2$ and associated calculated stiffnesses $K_1$, $K_2$ resulting from this simplification will be relatively small and can, in any event, be corrected by system simulation and on-vehicle measurements. Another simplifying assumption made in the torque balance diagram 200B of FIG. 7 is that the stiffnesses $K_1$ and $K_2$ are in the direction of the vehicle Z-axis. The stiffnesses $K_1$, $K_2$ may instead be considered along the local z-axis of each respective mount 422, 424, which is commonly called "focus angle" and is not perfectly aligned with vehicle Z-axis. Again, any error associated with this simplification can be corrected by system simulation and on-vehicle measurements.

In step 506, the second gradual rate of change of static stiffness $K_1$ under dynamic load of the right-side engine mount 424 can then be calculated using the simplified torque balance equation from the torque balance diagram of FIG. 7. Specifically, $$K_1=K_2(S_2/S_1);$$

wherein $K_1$ is the static stiffness in the Z-direction of the right-side engine mount 424 at a distance $S_1$ for a given dynamic load of the powertrain 412, and $K_2$ is the static stiffness in the Z-direction at the distance of the left-side engine mount 422 at a distance $S_2$ for the same dynamic load of the powertrain 412. As shown in FIG. 7, displacement D1 corresponding to force $P_{Bz}$ is equal to $P_{Bz}/K_1$ (i.e., $D1=P_{Bz}/K_1$) and displacement D2 corresponding to force $P_{Az}$ is equal to $P_{Az}/K_2$ (i.e., $D2=P_{Az}/K_2$). This results in $D1=D2(S1/S2)$; in other words, the motion of the powertrain 412 under torque T is such that the center of rotation is always at or close to the center of gravity CG of the powertrain 412. The avoidance of translation at the center of gravity CG of the powertrain 412 directly results in reduction of dynamic force at the mounts 422, 424, and 426 in the vertical direction.

In step 508, the powertrain mounting system 418 is provided and, in step 510, installed on the vehicle 410. The stiffness of the mounts 422 and 424 in directions other than the Z-direction, and the stiffness of the mount 426 can be determined by any suitable method.

While the best modes for carrying out the many aspects of the present teachings have been described in detail, those familiar with the art to which these teachings relate will recognize various alternative aspects for practicing the present teachings that are within the scope of the appended claims.

The invention claimed is:

1. A method of designing a powertrain mounting system for a vehicle powertrain, the powertrain mounting system having a plurality of powertrain mounts including a first powertrain mount and a second powertrain mount, the powertrain mounts having a spatial arrangement relative to the powertrain; the method comprising:
  selecting a first gradual rate of change of static stiffness under load for the first powertrain mount; wherein the first gradual rate of change of static stiffness of the first powertrain mount includes a first average rate of change of static stiffness in a first range of dynamic loads, and a second average rate of change of static stiffness in a second range of dynamic loads; wherein the first average rate of change of static stiffness is less than the second average rate of change of stiffness; wherein loads in the first range of dynamic loads are lower than loads in the second range of dynamic loads;
  determining a corresponding second gradual rate of change of static stiffness under load for the second powertrain mount using the selected first gradual rate of change of static stiffness in a static equilibrium torque balance equation of respective torques at at least the first and the second powertrain mounts based on the spatial arrangement of at least the first and second powertrain mounts relative to the powertrain; and
  providing the powertrain mounting system having the first powertrain mount exhibiting the first gradual rate of change of static stiffness when under load and the second powertrain mount exhibiting the corresponding second gradual rate of change of static stiffness when under load.

2. The method of claim 1, wherein the first gradual rate of change of static stiffness of the first powertrain mount includes a third average rate of change of static stiffness in a third range of dynamic loads; wherein the third average rate of change of static stiffness is greater than the second average rate of change of static stiffness; and wherein loads in the third range of dynamic loads are higher than loads in the second range of dynamic loads.

3. The method of claim 2, wherein the first gradual rate of change of static stiffness is a maximum rate at which the first powertrain mount satisfies a predetermined vehicle isolation requirement; and wherein the third gradual rate of change of static stiffness is a minimum rate at which displacement of the first powertrain mount remains below a predetermined total displacement.

4. The method of claim 1, wherein the powertrain mounting system is a three-point pendular mounting system; wherein the first powertrain mount is a rear torque strut; wherein the second powertrain mount is a first side transmission mount; wherein the powertrain mounts further include a second side engine mount having a third gradual rate of change of static stiffness under load; and wherein the third gradual rate of change of static stiffness is related to the first gradual rate of change of static stiffness and the second gradual rate of change of static stiffness by the static equilibrium torque balance equation.

5. The method of claim 1, wherein the powertrain mounting system is a neutral-torque axis, four-point powertrain mounting system; wherein the first powertrain mount is a front torque-reacting mount; wherein the second powertrain mount is a rear torque-reacting mount; wherein the powertrain mounts further include a first side transmission mount and a second side engine mount; wherein the static equilibrium torque balance equation includes only the respective torques at the first and the second powertrain mounts; and wherein the static equilibrium torque balance equation is based on the spatial arrangement of only the first and the second powertrain mounts relative to the powertrain.

6. The method of claim 1, wherein the powertrain mounting system is a rear wheel-drive powertrain mounting system having a first side engine mount, a second side engine mount, and a rear transmission mount; and wherein the first powertrain mount is one of the first side mount and the second side mount, and the second powertrain mount is the other of the first side mount and the second side mount.

7. A powertrain mounting system for a vehicle powertrain comprising:
  a first powertrain mount that exhibits a first gradual rate of change of static stiffness when under load;
  a second powertrain mount that exhibits a second gradual rate of change of static stiffness when under load;
  wherein the first gradual rate of change of static stiffness is related to the second gradual rate of change of static stiffness by a static equilibrium torque balance equation of respective torques at the first and the second powertrain mounts; wherein the static equilibrium torque balance equation is based on a spatial arrangement of the first and the second powertrain mounts relative to the powertrain;
  wherein the first gradual rate of change of static stiffness includes a first average rate of change of static stiffness in a first range of dynamic loads, and a second average rate of change of static stiffness in a second range of dynamic loads; wherein the first average rate of change of static stiffness is less than the second average rate of change of stiffness; and wherein loads in the first range of dynamic loads are lower than loads in the second range of dynamic loads.

8. The powertrain mounting system of claim 7, wherein the first gradual rate of change of static stiffness includes a third average rate of change of static stiffness in a third range of dynamic loads; wherein the third average rate of change of static stiffness is greater than the second average rate of change of static stiffness; and wherein loads in the third range of dynamic loads are higher than loads in the second range of dynamic loads.

9. The powertrain mounting system of claim 7, wherein the second gradual rate of change of static stiffness includes other increasing average rates of change of static stiffness in the different ranges of increasing dynamic loads.

10. The powertrain mounting system of claim 7, wherein the powertrain mounting system is a three-point pendular mounting system; wherein the first powertrain mount is a rear torque strut; wherein the second powertrain mount is a left-side transmission mount; wherein the powertrain mounts further include a right-side engine mount having a third gradual rate of change of static stiffness under load; and wherein the third gradual rate of change of static stiffness is related to the first gradual rate of change of static stiffness and the second gradual rate of change of static stiffness by the static equilibrium torque balance equation.

11. The powertrain mounting system of claim 7, wherein the powertrain mounting system is a neutral-torque axis, four-point powertrain mounting system; wherein the first powertrain mount is a front torque-reacting mount; wherein the second powertrain mount is a rear torque-reacting mount;

wherein the powertrain mounts further include a left-side transmission mount and a right-side engine mount; wherein the static equilibrium torque balance equation includes only the respective torques at the first and the second powertrain mounts; and wherein the static equilibrium torque balance equation is based on the spatial arrangement of only the first and the second powertrain mounts relative to the powertrain.

12. The powertrain mounting system of claim 7, wherein the powertrain mounting system is a rear wheel-drive powertrain mounting system having a left-side engine mount, a right-side engine mount, and a rear transmission mount; and wherein the first powertrain mount is one of the left-side engine mount and the right-side engine mount, and the second powertrain mount is the other of the left-side engine mount and the right-side engine mount.

13. A vehicle comprising:
a powertrain;
powertrain support structure;
powertrain mounts attaching the powertrain to the powertrain support structure;
wherein the powertrain mounts include a first powertrain mount that exhibits a first gradual rate of change of static stiffness when under load, and a second powertrain mount that exhibits a second gradual rate of change of static stiffness when under load;
wherein the first gradual rate of change of static stiffness is related to the second gradual rate of change of static stiffness by a static equilibrium torque balance equation of respective torques at at least the first and the second powertrain mounts; wherein the static equilibrium torque balance equation is based on a spatial arrangement of at least the first and the second powertrain mounts relative to the powertrain;
wherein the first gradual rate of change of static stiffness includes a first average rate of change of static stiffness in a first range of dynamic loads, and a second average rate of change of static stiffness in a second range of dynamic loads; wherein the first average rate of change of static stiffness is less than the second average rate of change of stiffness; and wherein loads in the first range of dynamic loads are lower than loads in the second range of dynamic loads.

14. The vehicle of claim 13, wherein the first gradual rate of change of static stiffness includes a third average rate of change of static stiffness in a third range of dynamic loads; wherein the third average rate of change of static stiffness is greater than the second average rate of change of static stiffness; and wherein loads in the third range of dynamic loads are higher than loads in the second range of dynamic loads.

15. The vehicle of claim 14, wherein the first gradual rate of change of static stiffness is a maximum rate at which the first powertrain mount satisfies a predetermined vehicle isolation requirement; and wherein the third gradual rate of change of static stiffness is a minimum rate at which displacement of the first powertrain mount remains below a predetermined total displacement.

16. The vehicle of claim 13, wherein the powertrain mounts are arranged as a three-point pendular mounting system; wherein the first powertrain mount is a rear torque strut; wherein the second powertrain mount is a left-side transmission mount; wherein the powertrain mounts further include a right-side engine mount having a third gradual rate of change of static stiffness under load; and wherein the third gradual rate of change of static stiffness is related to the first gradual rate of change of static stiffness and the second gradual rate of change of static stiffness by the static equilibrium torque balance equation.

17. The vehicle of claim 13, wherein the powertrain mounts are arranged as a neutral-torque axis, four-point powertrain mounting system; wherein the first powertrain mount is a front torque-reacting mount; wherein the second powertrain mount is a rear torque-reacting mount; wherein the powertrain mounts further include a left-side transmission mount and a right-side engine mount; wherein the static equilibrium torque balance equation includes only the respective torques at the first and the second powertrain mounts; and wherein the static equilibrium torque balance equation is based on the spatial arrangement of only the first and the second powertrain mounts relative to the powertrain.

18. The vehicle of claim 13, wherein the powertrain mounts are arranged as a rear wheel-drive powertrain mounting system having a left-side engine mount and a right-side engine mount; and wherein the first powertrain mount is one of the left-side engine mount and the right-side engine mount, and the second powertrain mount is the other of the left-side engine mount and the right-side engine mount.

* * * * *